(12) United States Patent
Matsuki

(10) Patent No.: US 8,329,540 B2
(45) Date of Patent: Dec. 11, 2012

(54) SEMICONDUCTOR DEVICE AND MANUFACTURING METHOD THEREOF

(75) Inventor: Takeo Matsuki, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 12/929,938

(22) Filed: Feb. 25, 2011

(65) Prior Publication Data
US 2011/0241097 A1    Oct. 6, 2011

(30) Foreign Application Priority Data
Mar. 30, 2010    (JP) .................. 2010-077975

(51) Int. Cl.
*H01L 21/8234*    (2006.01)
(52) U.S. Cl. ............... 438/275; 257/407; 257/E27.064; 257/E21.623; 257/E21.637; 257/E21.639
(58) Field of Classification Search ........... 438/154, 438/176, 199, 275, 283; 257/406–408, E21.639, 257/E21.637, E21.623, E29.16, E29.158, 257/E27.064
See application file for complete search history.

(56) References Cited

U.S. PATENT DOCUMENTS

| | | | |
|---|---|---|---|
| 6,881,631 B2* | 4/2005 | Saito et al. | 438/283 |
| 7,253,485 B2* | 8/2007 | Shibahara | 257/407 |
| 7,919,820 B2* | 4/2011 | Chung et al. | 257/369 |

OTHER PUBLICATIONS

H.Y. Yu et. al., "Fermi Pinning-Induced Thermal Instability of Metal-Gate Work Functions," IEEE Electron Device Letter, vol. 25, No. 5, May 2004, pp. 337-339.
M. Kadoshima et. al., "Improved FET characteristics by laminate design optimization of metal gates—Guidelines for optimizing metal gate stack structure," 2008 Symposium on VLSI Technology Digest of Technical Papers, pp. 48-49.

* cited by examiner

*Primary Examiner* — David Vu
(74) *Attorney, Agent, or Firm* — McGinn IP Law Group, PLLC

(57) ABSTRACT

Device isolation regions for isolating a device forming region are formed over a substrate. Subsequently, a gate insulation film is formed over the device forming region. Then, a lower gate electrode film comprised of a metal nitride film is formed over the gate insulation film. Further, a heat treatment is performed to the lower gate electrode film and then an upper gate electrode film is formed over the lower gate electrode film.

8 Claims, 4 Drawing Sheets

SEMICONDUCTOR DEVICE AND MANUFACTURING METHOD THEREOF

CROSS-REFERENCE TO RELATED APPLICATION

The disclosure of Japanese Patent Application No. 2010-77975 filed on Mar. 30, 2010 including the specification, drawings and abstract is incorporated herein by reference in its entirety

BACKGROUND

1. Field of the Invention

The present invention concerns a method of manufacturing a semiconductor device having a field effect transistor, and the semiconductor device.

2. Description of Related Art

In metal-oxide-semiconductor field effect transistors (MOSFETs), there is a technique of using an insulation layer having a higher dielectric constant (High-k material) than $SiO_2$ or SiON as a gate insulation film and using a metal or a metal nitride as a gate electrode. This technique can improve the current driving performance.

IEEE Electron Device Letters, vol. 25, No. 5, 2004, pp 337 to 339, written by H. Y. Yu (Non-patent document 1) describes use of an Si/metal nitride film where Si is stacked on a metal nitride film as a gate electrode.

2008 Symposium on VLST Technology Digest of Technical Papers, pp 48 to 49, written by M. Kadoshima, et al. (Non-document 2) describes that an apparent work function of a gate electrode can be controlled by adjusting the thickness of a metal nitride film used for a gate electrode. Specifically, the non-patent document 2 describes that an apparent work function of the gate electrode increases as the thickness of a metal nitride film used for the gate electrode increases more. When the apparent work function of the gate electrode increases, a threshold voltage Vt of pMOSFET is lowered (absolute value for negative Vt value is decreased) as the apparent work function of the gate electrode increases and the threshold voltage Vt of nMOSFET increases (absolute value for positive Vt value is further increased). The non-patent document 2 describes that a CMOSFET in which both of a pMOSFET and an nMOSFET have lower threshold value voltages (small absolute value for Vt value) by controlling the threshold voltage Vt depending on the thickness of the metal nitride film.

SUMMARY

The present inventor has recognized as follows. When a gate electrode is formed by using the structure described in the non-patent document 1 for a gate electrode, and then impurities introduced into source-drain regions are activated electrically by a heat treatment at high temperature, there was a problem that the apparent work function of the gate electrode is changed. It may be considered to solve the problem described above by controlling the film thickness while considering the fluctuation of the work function by applying the technique described in the non-patent document 2. In this case, however, the thickness of the metal nitride film that forms the gate electrode varies in a wafer plane and, accordingly, the threshold voltage Vt of the gate electrode varies in the wafer plane. When the threshold voltage Vt varies in the wafer plane, it becomes difficult to mass-produce semiconductor integrated circuit devices by using a semiconductor wafer of a large diameter. Accordingly, it is necessary that fluctuation of the threshold voltage Vt can be suppressed by other methods.

According to an aspect of the present invention, a method of manufacturing a semiconductor device includes:

forming a first gate insulation film over a first device forming region disposed in a substrate, forming a lower gate electrode film comprising a metal nitride film over the first gate insulation film, a heat treatment is performed to the lower gate electrode film, and forming an upper gate electrode film over the lower gate electrode film.

In an nMOSFET, the threshold voltage of a gate electrode is lowered by performing a heat treatment to a gate electrode film comprising a metal nitride film in an open state. According to the invention, the heat treatment is performed to the lower gate electrode film comprising the metal nitride film before formation of the upper gate electrode film. Accordingly, variation of the work function of the gate electrode can be suppressed in an MOSFET in which the gate electrode comprises the metal nitride film.

According to another aspect of the present invention, a semiconductor device includes a substrate, a first gate insulation film formed over a first device forming region disposed in the substrate, a second gate insulation film formed over a second device forming region disposed in the substrate, a lower gate electrode film formed over the first insulation film and the second gate insulation film and having a metal nitride film, a mask film formed over the lower gate electrode film situated over the second gate insulation film, and an upper gate electrode film formed over the lower gate electrode film and the mask film.

According to the invention, a current driving performance can be improved in the MOSFET in which the gate electrode comprises the metal nitride film.

DESCRIPTION OF THE ACCOMPANYING DRAWINGS

DETAILED DESCRIPTION OF THE PREFERRED EMBODIMENTS

Figure 1A:
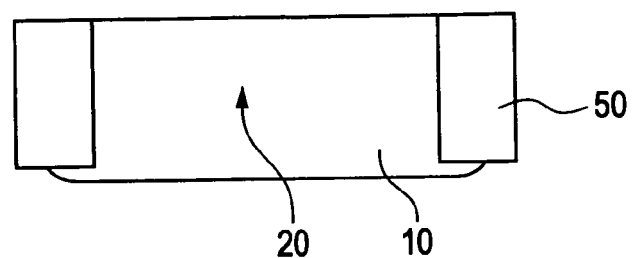
FIG. 1A to FIG. 1D are cross sectional views showing a method of manufacturing a semiconductor device according to a first embodiment.

Preferred embodiments of the invention are to be described with reference to the drawings. Throughout the drawings, identical constituent elements carry the same reference numerals for which description is optionally omitted.

FIG. 1A to FIG. 1D are cross sectional views showing the method of manufacturing the semiconductor device according to the first embodiment. FIG. 2 is a cross sectional view showing a semiconductor device formed by the manufacturing method shown in FIG. 1A to FIG. 1D. In the manufacturing method, a gate insulation film 100 is formed over a device forming region 20 disposed in a substrate 10. Then, a lower gate electrode film 200 is formed over the gate insulation film 100. Further, a heat treatment is performed to the lower gate electrode film 200. Then, an upper gate electrode film 220 is formed over the lower gate electrode film 200. Subsequently, a semiconductor device shown in FIG. 2 is formed by way of an etching step and an ion implantation step.

Figure 1B:
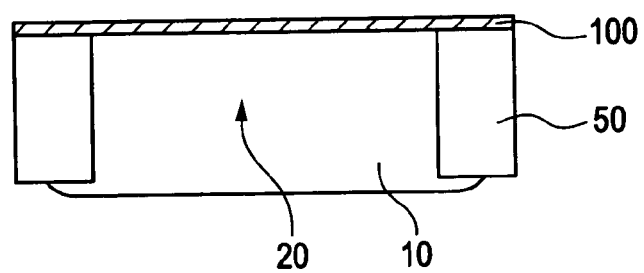
Figure 1C:
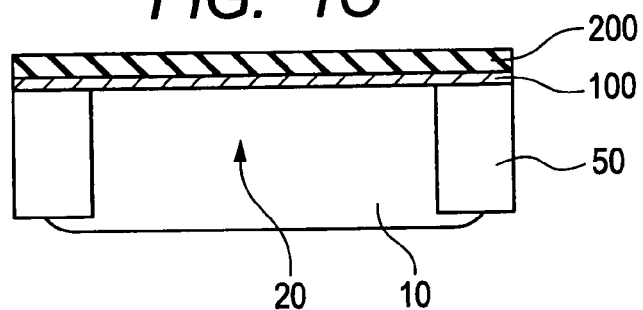
Figure 1D:
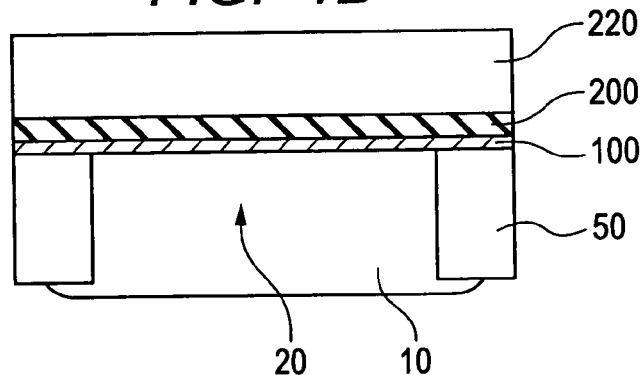
Figure 2:
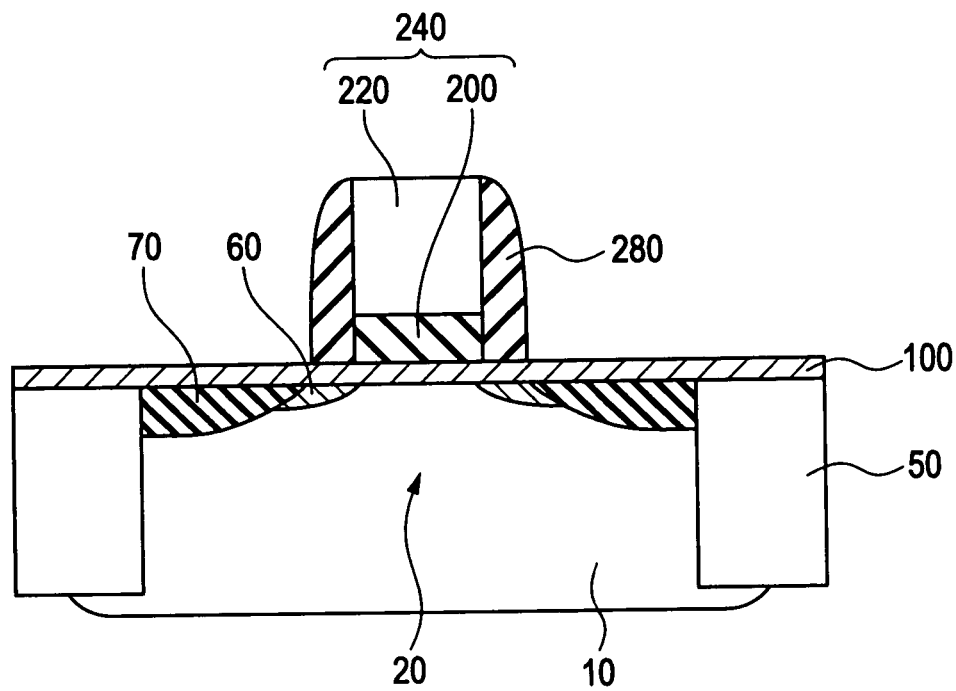
FIG. 2 is a cross sectional view showing a semiconductor device formed by the manufacturing method shown in FIG. 1.

A method of manufacturing the semiconductor device according to the first embodiment is to be described in details with reference to FIG. 1A to FIG. 1D, and FIG. 2. At first, as shown in FIG. 1A, device isolation regions 50 are formed in the substrate 10. Thus, the device forming region 20 having the transistor formed therein is isolated. For example, the device forming region 20 is a region for nMOSFET. The substrate 10 comprises, for example, Si, Ge, or a mixture of Si and Ge. Then, as shown in FIG. 1B, the gate insulation film 100 is deposited over the device forming region 20. The gate insulation film 100 is formed, for example, by growing $HfO_2$ or $HfZrO_x$ to several nm on $SiO_2$ or SiON, for example, of about 1 nm thickness, and performing a heat treatment at about 850° C. When the substrate 10 comprises Ge, or a mixture of Si and Ge, the gate insulation film 100 may be formed, for example, of an $SiO_2$ film, a $GeO_2$ film, a laminate film of a CVD-$SiO_2$ film and a High-k film ($HfO_2$ or $HfZrO_x$), or a single layer of High-k film ($HfO_2$ or $HfZrO_x$), etc., formed by a CVD method.

Then, as shown in FIG. 1C, a lower gate electrode film 200 is deposited over the gate insulation film 100. The lower gate electrode film 200 comprises, for example, TiN, TaN, WN, or MoN. Further, the lower gate electrode film 200 has a thickness, for example, of 3 to 10 nm.

Then, a heat treatment is performed in a state where the lower electrode film 200 is exposed as shown in FIG. 1C. The heat treatment to the lower gate electrode film 200 is performed at a temperature, for example, of 600° C. or higher. Further, the heat treatment for the lower gate electrode film 200 is performed, for example, in a vacuum or a nitrogen atmosphere.

As shown in FIG. 1D, an upper gate electrode film 220 is deposited over the lower gate electrode film 200. The gate electrode film 220 comprises, for example, Si, Ge, or a mixture of Si and Ge. Then, the lower gate electrode film 200 and the upper gate electrode film 220 are removed selectively to form a gate electrode 240 as shown in FIG. 2.

Then, as shown in FIG. 2, impurity ions are injected into the substrate 10 by using the device isolation regions 50 and the gate electrode 240 as a mask. Thus, source/drain extension regions 60 are formed in the device forming region 20. Then, an insulation film is formed over the gate electrode 240, over the device forming region 20, and over the device isolation region 50, and the insulation film is etched back. Thus, an offset spacer 280 is formed on the side wall of the gate electrode 240 as shown in FIG. 2.

Then, impurity ions are injected into the substrate 10 by using the gate electrode 240, the offset spacer 280, and the device isolation regions 50 as a mask. Thus, source/drain regions 70 are formed in the device isolation 20 as shown in FIG. 2.

Figure 3:
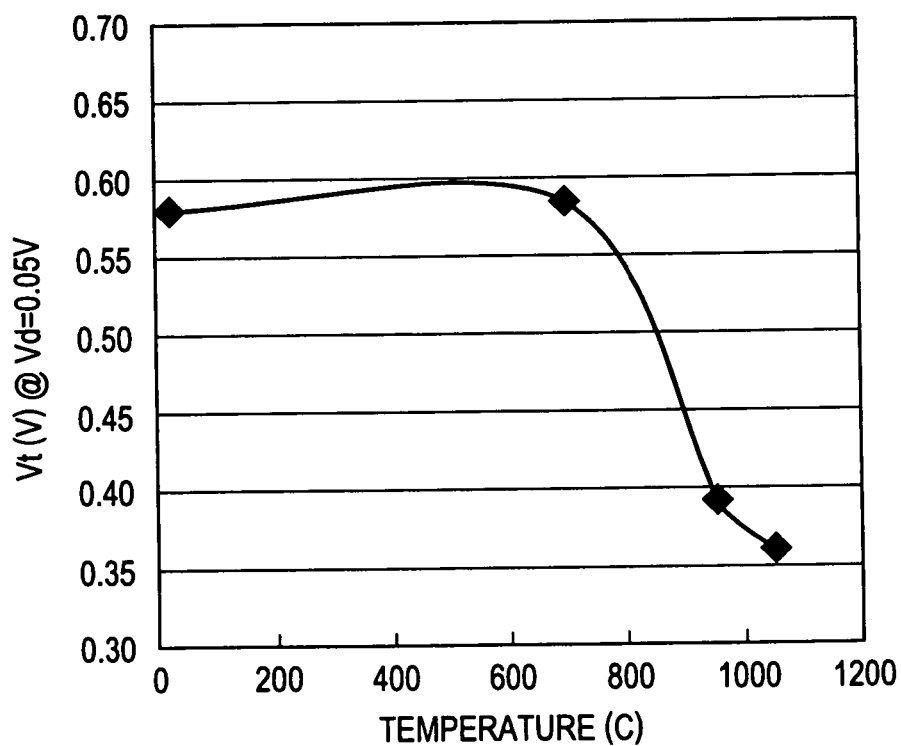
FIG. 3 is a graph showing a correlation between a heat treatment temperature and a threshold voltage of a gate electrode in the method of manufacturing the semiconductor device shown in FIG. 2.

An advantageous effect of this embodiment is to be described. FIG. 3 is a graph showing a correlation between a heat treatment temperature and a threshold voltage of the gate electrode in the heat treatment step for the lower gate electrode film 200 before forming the upper electrode 220. The threshold voltage Vt of the gate electrode of the nMOSFET is lowered (absolute value for positive value is lowered) by performing the heat treatment at 600° C. or higher in the open state of the gate electrode film comprising the metal nitride film in an nMOSFET. In the nMOSFET, as the work function decreases, the threshold voltage Vt is lowered and a higher on current can be obtained at an identical drain voltage.

According to this embodiment, a heat treatment is performed to the lower gate electrode film 200 comprised of the metal nitride film before formation of the upper gate electrode film 220. That is, at the timing of performing the heat treatment, the lower gate electrode film 200 is not covered at all. In such a process, increase of the apparent work function of the gate electrode can be controlled and the current driving performance can be improved in the MOSFET in which the gate electrode comprises the metal nitride film as shown in FIG. 3.

FIG. 4A to FIG. 4E are cross sectional views showing a method of manufacturing a semiconductor device according to a second embodiment, which corresponds to FIGS. 1A to 1D. FIG. 5 is a cross sectional view showing the semiconductor device formed by the manufacturing method shown in FIGS. 4A to 4E which corresponds to the first embodiment. The method of manufacturing the semiconductor device shown in FIGS. 4A to 4E is identical with the method of manufacturing the semiconductor device shown in FIGS. 1A to 1D excepting that it includes the step of forming and removing a mask 250. A semiconductor device shown in FIG. 5 has the similar configuration as the semiconductor device shown in FIG. 2 except that a plurality of transistors are provided.

Figure 4A:
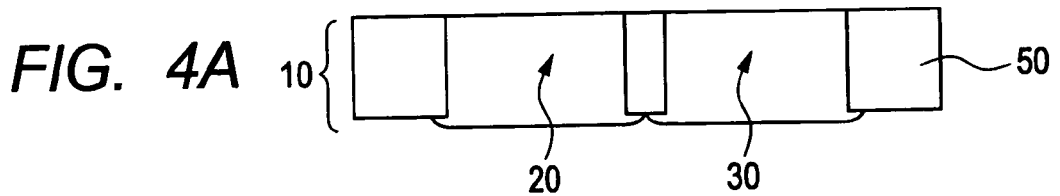
FIG. 4A to FIG. 4E are cross sectional views showing a method of manufacturing a semiconductor device according to a second embodiment.
Figure 4B:
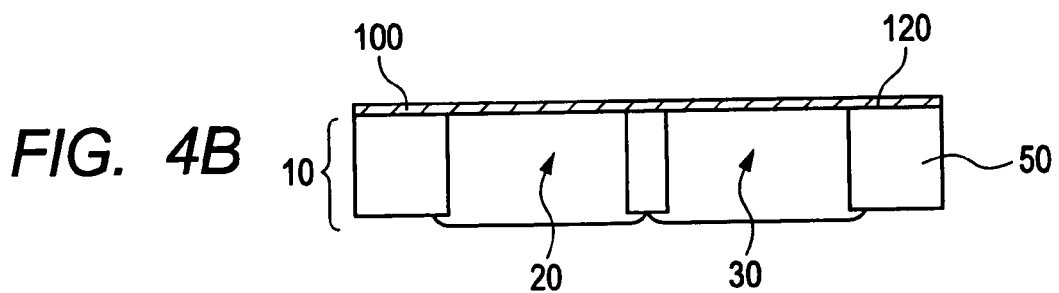
Figure 4C:
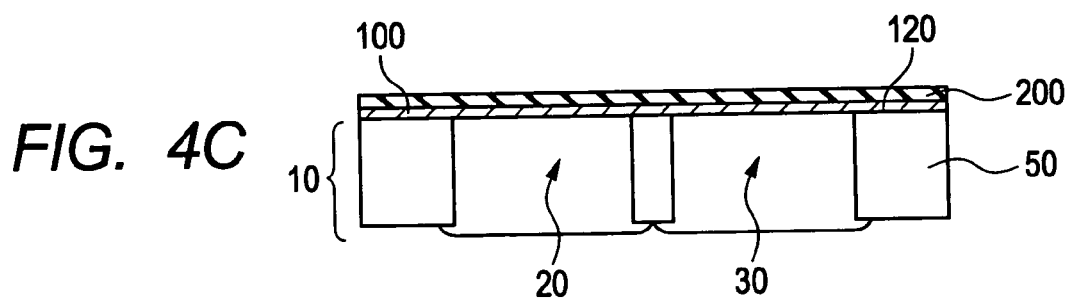
Figure 4D:
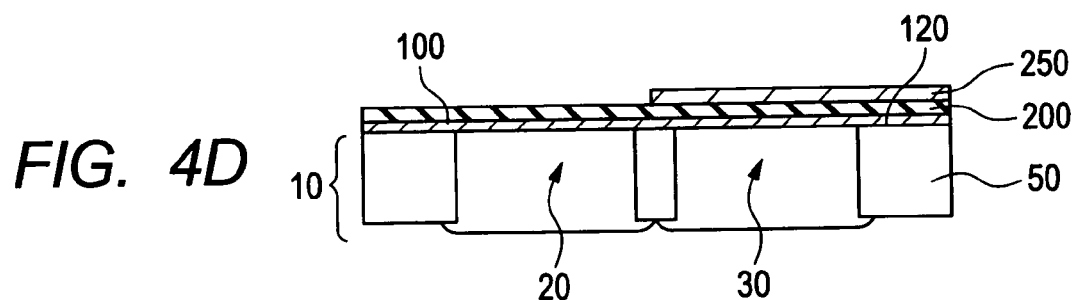
Figure 4E:
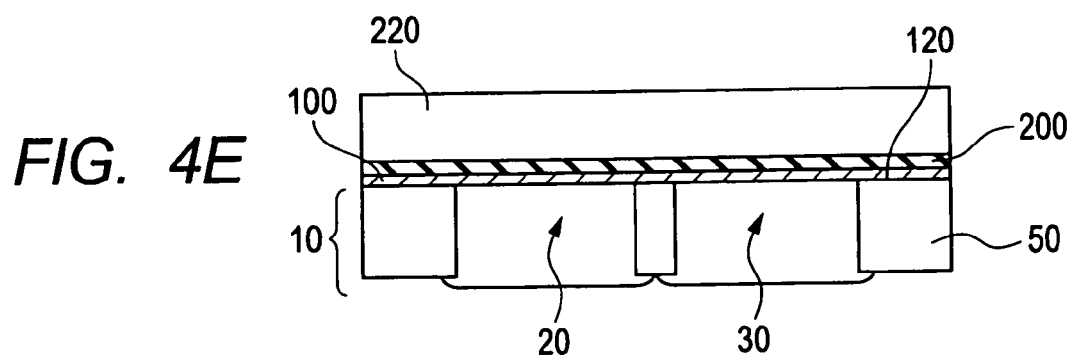
Figure 5:
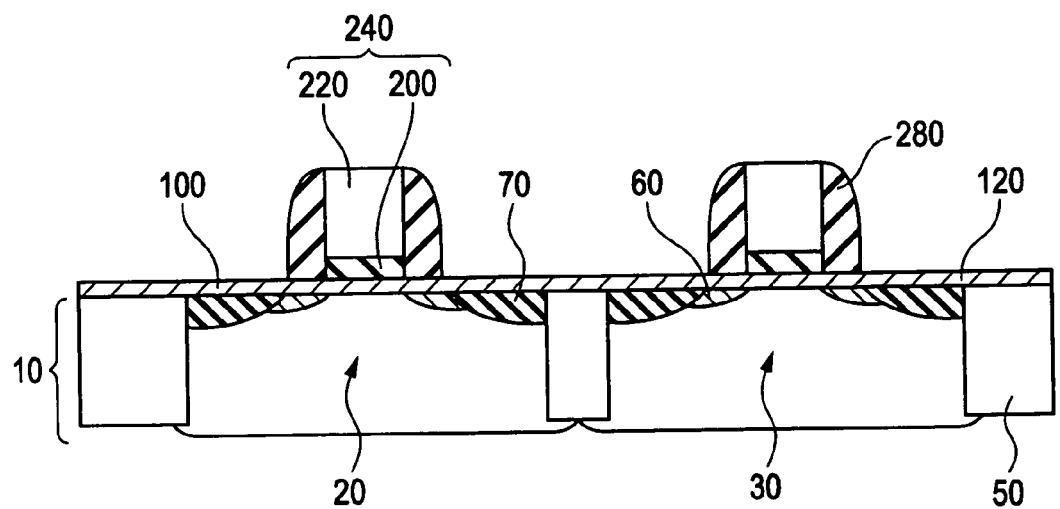
FIG. 5 is a cross sectional view showing a semiconductor device formed by the manufacturing method shown in FIG. 4.

The method of manufacturing the semiconductor device according to the second embodiment is to be described specifically with reference to FIG. 4A to FIG. 4E and FIG. 5. At first, device isolation regions 50 are formed in the substrate 10, and a device forming region 20 and a device forming region 30 are isolated from each other (FIG. 4A). For example, the device forming region 20 is a region for nMOSFET and the device forming region 30 is a region for pMOSFET. Then, a gate insulation film 100 is formed over the device forming region 20 and a gate insulation film 120 is formed over the device forming region 30 (FIG. 4B). The step of forming the gate insulation film 100 and the gate insulation film 120 are performed, for example, in one identical step. Then, the lower gate electrode film 200 is formed (FIG. 4C). The forming procedures described above are similar with those of the first embodiment.

Then, after forming the lower gate electrode film 200, a mask film 250 is formed as shown in FIG. 4D. The mask film 250 is formed over the lower gate electrode film 200 situated over the gate insulation film 120. Further, the mask film 250 is formed, for example, by depositing $SiO_2$ using plasma CVD and selectively removing the mask film over the lower gate electrode film 200 situated over the gate insulation film 100. Then, a heat treatment is performed to the lower gate electrode 200. Then, the mask film 250 over the gate electrode film 200 is removed.

Then, an upper gate electrode film 220 is deposited over the lower gate electrode film 200 (FIG. 4E). Then, a gate electrode 240, an extension region 60, an offset spacer 280, and source/drain regions 70 are formed. The forming procedures are similar with those of the first embodiment. Thus, a semiconductor region shown in FIG. 5 is formed.

Also in this embodiment, the heat treatment is performed to the lower gate electrode film 200 comprising the metal nitride film before forming the upper gate electrode film 220. Accordingly, the same effect as that of the first embodiment can be obtained.

Further, in a pMOSFET, the threshold voltage Vt of the gate electrode of the pMOSFET is lowered (absolute value for the negative Vt value is decreased) by performing a heat treatment to a gate electrode film comprising a metal nitride film while covering the electrode film with the mask film. In the pMOSFET, the threshold voltage Vt is lowered as the work function is increased and higher on current is obtained at an identical drain voltage.

According to this embodiment, the heat treatment is performed to the lower gate electrode film 200 after forming the mask film 250 over the lower gate electrode film 200 situated over the gate insulation film 120. That is, at the timing of performing the heat treatment, the lower gate electrode film 200 situated over the gate insulation film 200 is covered with the mask film. Accordingly, decrease in the apparent work function of the gate electrode can be controlled and the current driving performance can be improved in a selected pMOSFET among a plurality of MOSFETs formed in the substrate.

Further, the threshold voltage Vt can be lowered by the heat treatment only for one nMOSFET selected from the plurality of MOSFETs. This enables to arrange one nMOSFET and other nMOSFETs of different threshold voltages in one substrate without introducing impurities.

Figure 6:
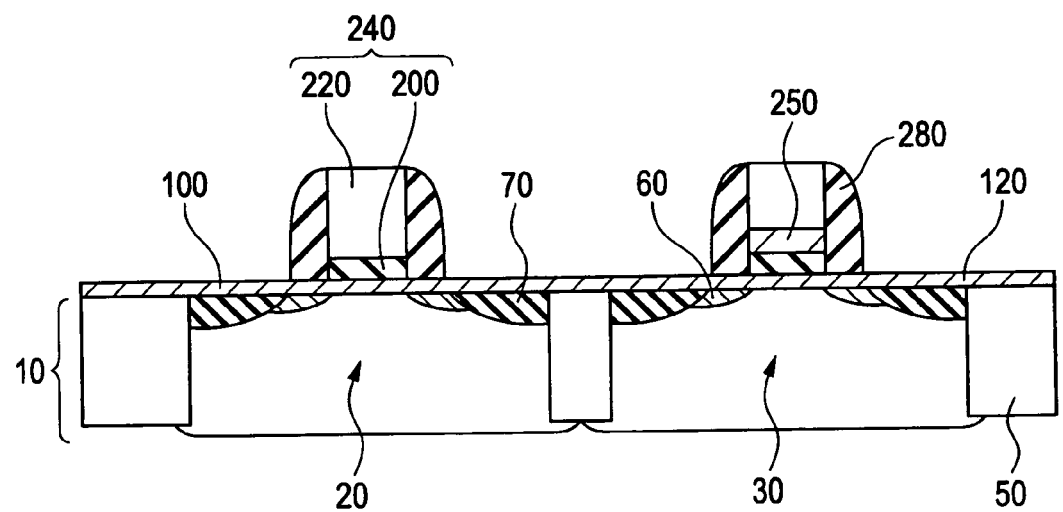
FIG. 6 is a cross sectional view showing a semiconductor device according to a third embodiment.

FIG. 6 is a cross sectional view showing a semiconductor device according to a third embodiment, which corresponds to FIG. 5 for the second embodiment. The method of manufacturing the semiconductor device shown in FIG. 6 is similar with the method of manufacturing the semiconductor device according to the second embodiment shown in FIG. 4 except that the mask film is not removed after the step of performing heat treatment to the lower gate electrode gate 200. Further, the semiconductor device shown in FIG. 6 has a configuration identical with that of the semiconductor device shown in FIG. 5 excepting that a mask film 250 is situated between the lower gate electrode film 200 and the upper gate electrode film 220 situated over the gate insulation film 120.

The mask film 250 shown in FIG. 6 comprises, for example, Si, Ge, or a mixture of Si and Ge. Further, the mask film 250 is deposited, for example, to a thickness of about 10 nm by PVD.

Also in this embodiment, a heat treatment is performed to the lower gate electrode film 200 comprising the metal nitride film before forming the upper gate electrode film 220. Further, a heat treatment is performed to the lower gate electrode film 200 after forming the mask film 250 over the lower gate electrode 200 situated over the gate insulation film 120. Accordingly, the same effects as those of the second embodiment can be obtained.

Further, this embodiment does not have the step of removing the mask film 250. Accordingly, the number of steps can be saved in the manufacture of the semiconductor device.

While preferred embodiments of the invention have been descried with reference to the drawings, they are examples of the invention and various other constitutions than those described above can also be adopted.

What is claim is:

1. A method of manufacturing a semiconductor device comprising:
    forming a first gate insulation film over a first device forming region disposed in a substrate;
    forming a lower gate electrode film comprising a metal nitride film over the first gate insulation film;
    performing a heat treatment to the lower gate electrode film;
    forming an upper gate electrode film over the lower gate electrode film;
    forming a second gate insulation film over a second device forming region disposed in the substrate before the step of forming the lower gate electrode film,
    wherein said forming the lower gate electrode film includes forming the lower gate electrode film also over the second gate insulation film; and
    forming a mask film over the lower gate electrode film situated over the second gate insulation film between said forming the lower gate electrode film and said performing a heat treatment to the lower gate electrode film,
    wherein said forming the upper gate electrode film includes forming the upper gate electrode film also over the lower gate electrode film situated over the second gate insulation film.

2. The method of manufacturing a semiconductor device according to claim 1, wherein the lower gate electrode film includes one of titanium nitride, tantalum nitride, tungsten nitride, or molybdenum nitride.

3. The method of manufacturing a semiconductor device according to claim 1, wherein the upper gate electrode film includes one of silicon, germanium, or a mixture of silicon and germanium.

4. The method of manufacturing a semiconductor device according to claim 1, wherein the transistor formed in the first device forming region is an n-channel type.

5. The method of manufacturing a semiconductor device according to claim 1, further comprising:
    removing the mask film between said performing the heat treatment to the lower gate electrode film and said forming the upper gate electrode film.

6. The method of manufacturing a semiconductor device according to claim 1, wherein the mask film includes silicon, germanium, or a mixture of silicon and germanium.

7. The method of manufacturing a semiconductor device according to claim 1, wherein the mask film comprises a silicon oxide film.

8. The method of manufacturing a semiconductor device according to claim 1, wherein the atmosphere in the step of performing the heat treatment to the lower gate electrode film comprises a vacuum or nitrogen atmosphere.

* * * * *